United States Patent
Chang

(10) Patent No.: US 8,248,132 B2
(45) Date of Patent: Aug. 21, 2012

(54) OSCILLATION SIGNAL GENERATOR FOR COMPENSATING FOR I/Q MISMATCH AND COMMUNICATION SYSTEM INCLUDING THE SAME

(75) Inventor: Jae Hong Chang, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 78 days.

(21) Appl. No.: 12/858,833

(22) Filed: Aug. 18, 2010

(65) Prior Publication Data

US 2011/0074482 A1    Mar. 31, 2011

(30) Foreign Application Priority Data

Sep. 28, 2009  (KR) .................. 10-2009-0091959

(51) Int. Cl.
*H03K 3/00* (2006.01)
*H03K 5/13* (2006.01)
*H03H 11/16* (2006.01)
(52) U.S. Cl. ................... 327/238; 327/239; 327/240
(58) Field of Classification Search .............. 327/237, 327/238, 239
See application file for complete search history.

(56) References Cited

U.S. PATENT DOCUMENTS

| | | | |
|---|---|---|---|
| 6,029,059 A * | 2/2000 | Bojer | 455/326 |
| 2008/0151977 A1 * | 6/2008 | Choi | 375/219 |
| 2009/0045861 A1 | 2/2009 | Hayden et al. | |

FOREIGN PATENT DOCUMENTS

| | | |
|---|---|---|
| JP | 2006-094478 | 4/2006 |
| JP | 2008-113411 | 5/2008 |
| JP | 2009-050006 | 3/2009 |
| KR | 1020080037846 | 5/2008 |

* cited by examiner

*Primary Examiner* — John Poos
(74) *Attorney, Agent, or Firm* — F. Chau & Associates, LLC.

(57) ABSTRACT

An oscillation signal generator for compensating for an in-phase (I)/quadrature-phase (Q) mismatch and a communication system including the same are provided. The oscillation signal generator includes a first latch configured to generate an I oscillation signal, a second latch that is cross-coupled with the first latch and generates a Q oscillation signal, and a phase compensator connected to at least one of the first latch or the second latch. The phase compensator complementarily adjusts bias currents of the first and second I differential transistor pairs of the first latch and/or complementarily adjusts bias currents of the first and second Q differential transistor pairs of the second latch. Accordingly, the I/Q mismatch is compensated for without an additional device, so that the phase match between an I signal and a Q signal is improved in the communication system.

13 Claims, 14 Drawing Sheets

OSCILLATION SIGNAL GENERATOR FOR COMPENSATING FOR I/Q MISMATCH AND COMMUNICATION SYSTEM INCLUDING THE SAME

CROSS-REFERENCE TO RELATED APPLICATIONS

This application claims the benefit of Korean Patent Application No. 10-2009-0091959, filed on Sep. 28, 2009, in the Korean Intellectual Property Office, the disclosure of which is incorporated by reference herein in its entirety.

BACKGROUND

The present inventive concept relates to an oscillation signal generator, and more particularly, to an oscillation signal generator for compensating for a phase mismatch between an in-phase (I) signal and a quadrature-phase (Q) signal and a communication system including the same.

In wireless communication systems, radio frequency (RF) transmitters usually transmit data over two channels, i.e., an I channel and a Q channel. Accordingly, an I local oscillation signal and a Q local oscillation signal which have a 90-degree phase difference therebetween are required to perfectly restore a signal. When the phase difference between the I local oscillation signal and the Q local oscillation signal is not exactly 90 degrees, a bit error rate increases in a finally restored signal. In particular, when a direct conversion receiver or an image-reject receiver, in which a signal is divided into two channels at high frequency, is used, a mismatch between an I signal and a Q signal may cause serious problems in an overall system.

In actual RF receivers, the characteristics of delay cells included in a local oscillator do not ideally coincide with each other due to a difference in the thickness of an insulator, the size of an element, or the space between elements, various crystal structures of semiconductor materials, or layout mismatch. Such disagreement between the characteristics of the delay cells causes a phase mismatch between an I local oscillation signal and a Q local oscillation signal output from the local oscillator, which is a major cause of I/Q mismatch in a receiver. Furthermore, a mismatch between elements on I and Q paths of the receiver also causes the I/Q mismatch in the receiver.

To overcome this problem, a method of compensating a baseband I signal and a baseband Q signal which have passed through a mixer and a method of compensating an I path and a Q path of an RF signal have been introduced. As for these methods, however, a phase shift block for compensating for the phase mismatch between an I signal and a Q signal is additionally required and since an inherent amplitude mismatch needs to be considered, a phase mismatch compensation range is limited.

SUMMARY

Some embodiments of the present inventive concept provide an oscillation signal generator for improving the phase match between an in-phase (I) signal and a quadrature-phase (Q) signal in a transmitter and a receiver by compensating for an I/Q mismatch and a communication system including the same.

According to some embodiments of the present inventive concept, there is provided an oscillation signal generator for compensating for an I/Q mismatch. The oscillation signal generator includes a first latch configured to generate an I oscillation signal, a second latch that is cross-coupled with the first latch and generates a Q oscillation signal, and a phase compensator connected to at least one of the first latch or the second latch. The first latch includes a first I differential transistor pair configured to operate in response to a clock signal and a second I differential transistor pair configured to operate in response to a complementary clock signal. The second latch includes a first Q differential transistor pair configured to operate in response to the complementary clock signal and a second Q differential transistor pair configured to operate in response to the clock signal. The phase compensator complementarily adjusts a bias current of the first I differential transistor pair and a bias current of the second I differential transistor pair and/or complementarily adjusts a bias current of the first Q differential transistor pair and a bias current of the second Q differential transistor pair.

The phase compensator may include a first offset current source that is connected to a first common node of the first I differential transistor pair and supplies a first offset current to the first common node and a second offset current source that is connected to a second common node of the second I differential transistor pair and supplies a second offset current to the second common node.

The phase compensator may further include a third offset current source that is connected to a third common node of the first Q differential transistor pair and supplies a third offset current to the third common node and a fourth offset current source that is connected to a fourth common node of the second Q differential transistor pair and supplies a fourth offset current to the fourth common node.

BRIEF DESCRIPTION OF THE DRAWINGS

The above and other features and advantages of the present inventive concept will become more apparent by describing in detail exemplary embodiments thereof with reference to the attached drawings in which.

DETAILED DESCRIPTION OF THE EMBODIMENTS

Figure 1:
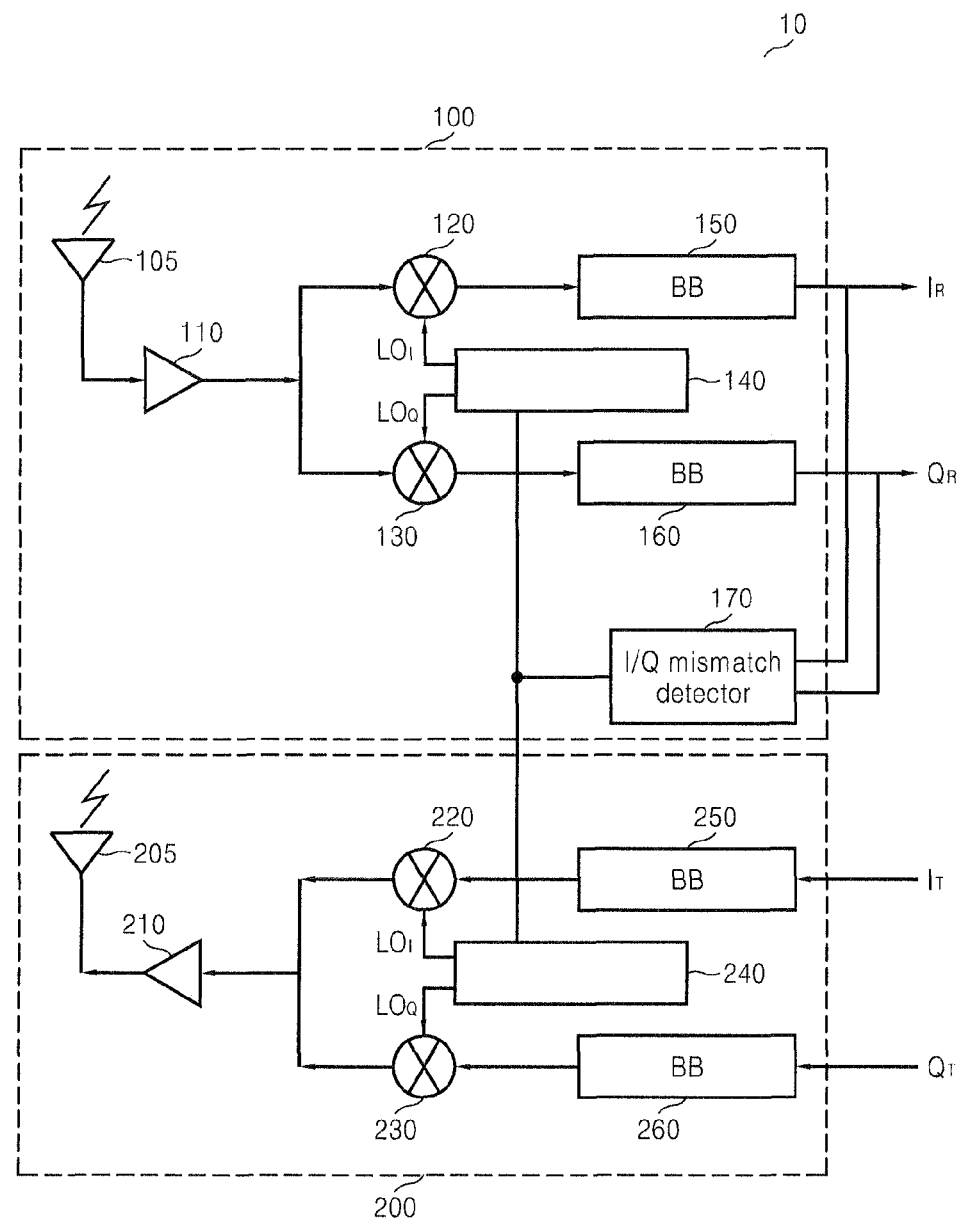
FIG. 1 is a schematic diagram of a wireless communication system according to some embodiments of the present inventive concept.

The present inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic diagram of a wireless communication system 10 according to some embodiments of the present inventive concept. The wireless communication system 10 includes a receiver 100 and a transmitter 200. The wireless communication system 10 may be an electronic device having a receiver 100 and a transmitter 200. For example, the wireless communication system 10 may be a mobile phone, a personal digital assistant (PDA), a digital multimedia broadcasting (DMB) terminal, a media player, a smart phone, or a portable computer, but the present inventive concept is not limited thereto.

The receiver 100 includes a first antenna 105, a low noise amplifier 110, a first mixer 120, a second mixer 130, a first oscillation signal generator 140, a first baseband circuit 150, a second baseband circuit 160, and an in-phase (I)/quadrature-phase (Q) mismatch detector 170.

The low noise amplifier 110 amplifies a radio frequency (RF) signal received through the antenna 105 and then outputs the amplified RF signal to the first and second mixers 120 and 130. The first and second mixers 120 and 130 mix the amplified RF signal with an I local oscillation signal $LO_I$ and a Q local oscillation signal $LO_Q$, respectively, received from the first oscillation signal generator 140 and output intermediate frequency or baseband signals, respectively. The first baseband circuit 150 and the second baseband circuit 160 amplify and filter a signal output from the first mixer 120 and a signal output from the second mixer 130, respectively, and output an I signal $I_R$ and a Q signal $Q_R$, respectively.

The transmitter 200 of the wireless communication system 10 includes a second antenna 205, a power amplifier 210, a third mixer 220, a fourth mixer 230, a second oscillation signal generator 240, a third baseband circuit 250, and a fourth baseband circuit 260. Although not shown in FIG. 1, an I signal $I_T$ and a Q signal $Q_T$ of the transmitter 200 are input to the I/Q mismatch detector 170, so that an I/Q mismatch is detected. The power amplifier 210, the third mixer 220, the fourth mixer 230, the second oscillation signal generator 240, the third baseband circuit 250, and the fourth baseband circuit 260 included in the transmitter 200 operate in reverse to the way in which the low noise amplifier 110, the first mixer 120, the second mixer 130, the first oscillation signal generator 140, the first baseband circuit 150, and the second baseband circuit 160 included in the receiver 100 operate.

Figure 2:
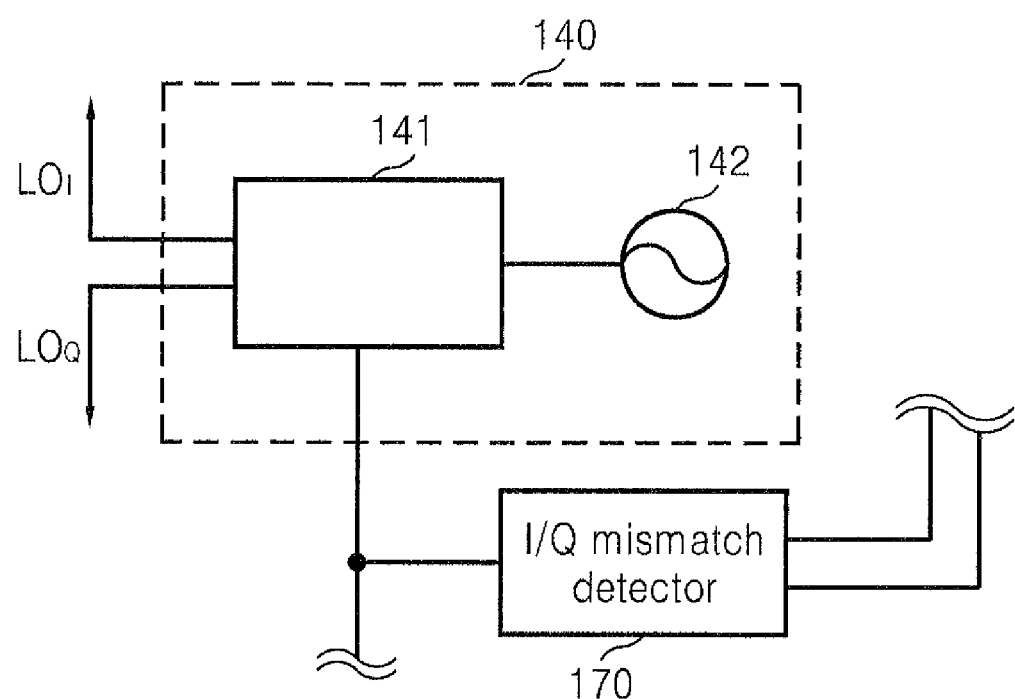
FIG. 2 is a diagram for explaining a first oscillation signal generator illustrated in FIG. 1 in detail according to some embodiments of the present inventive concept.

FIG. 2 is a diagram for explaining the first oscillation signal generator 140 illustrated in FIG. 1 in detail according to some embodiments of the present inventive concept. Although only the first oscillation signal generator 140 of FIG. 1 is illustrated in FIG. 2, the second oscillation signal generator 240 of FIG. 1 may have the same structure as shown in FIG. 2. Referring to FIG. 2, the first oscillation signal generator 140 includes a quadrature divider 141 and a local oscillator 142. The quadrature divider 141 may be a ½ frequency divider having a function of compensating for an I/Q mismatch. The quadrature divider 141 adjusts the phases of an I local oscillation signal $LO_I$ and a Q local oscillation signal $LO_Q$ output from the local oscillator 142 so that the phase difference between the I signal $I_R$ and the Q signal $Q_R$ is 90 degrees. At this time, the I/Q mismatch detector 170 detects a phase error (i.e., an I/Q phase mismatch amount) between the I signal $I_R$ and the Q signal $Q_R$ and the quadrature divider 141 adjusts the phases of the I local oscillation signal $LO_I$ and the Q local oscillation signal $LO_Q$ based on a result of the detection. The more the phase difference between the I signal $I_R$ and the Q signal $Q_R$ deviates from 90 degrees, the more the phase mismatch amount between the I signal $I_R$ and the Q signal $Q_R$ increases.

Figure 3A:
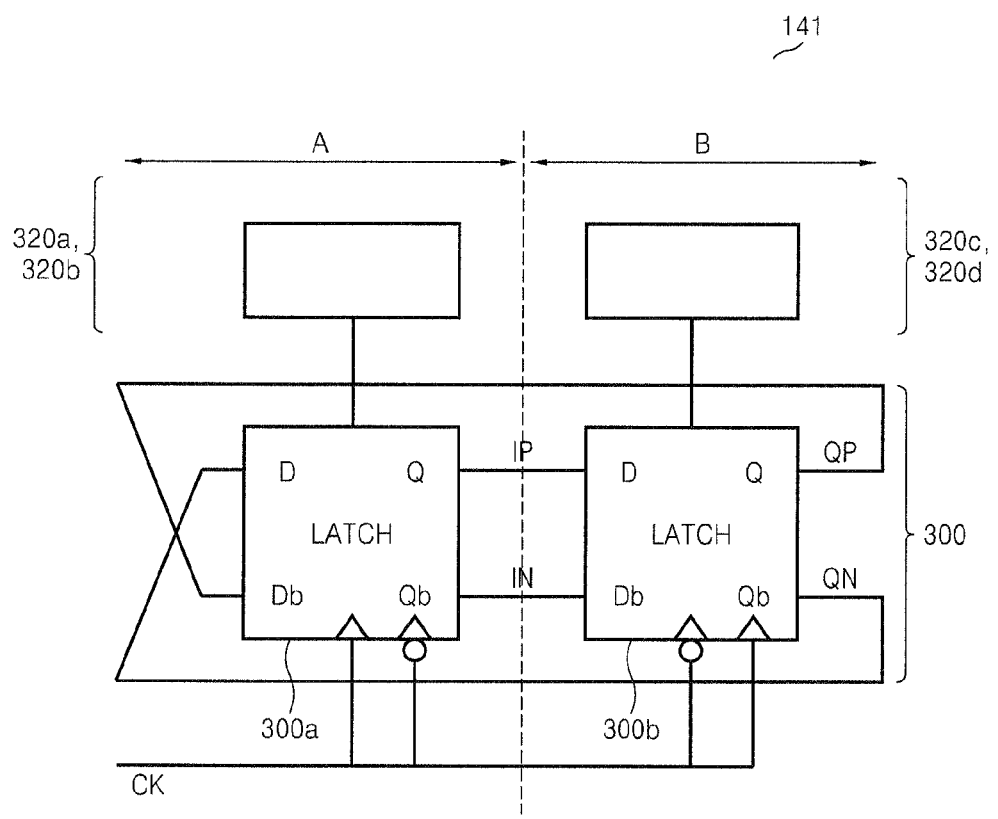
FIG. 3A is a schematic block diagram of a quadrature divider according to some embodiments of the present inventive concept.
Figure 3B:
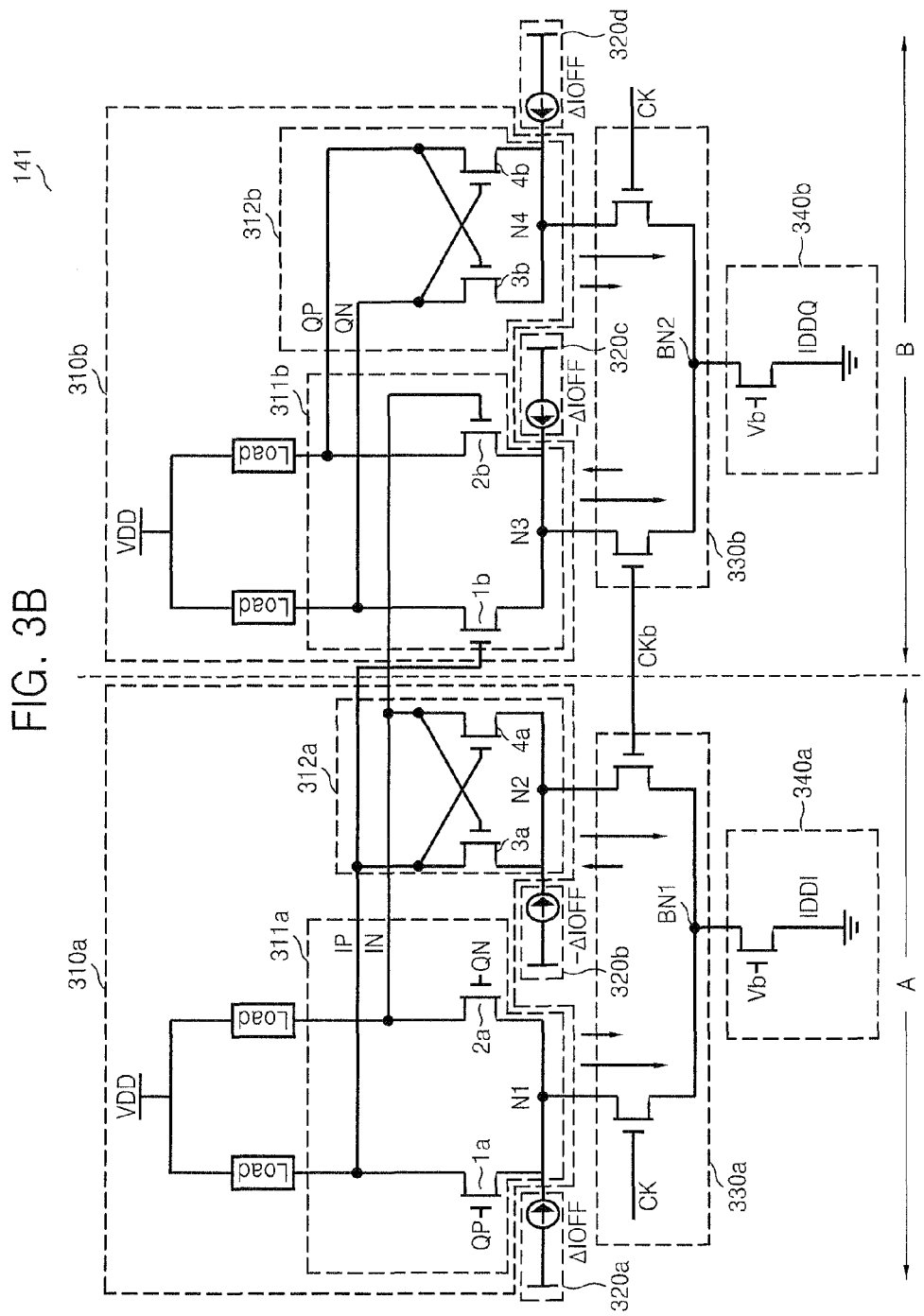
FIG. 3B is a circuit diagram of the quadrature divider illustrated in FIG. 3A according to some embodiments of the present inventive concept.

FIG. 3A is a schematic block diagram of the quadrature divider 141 according to some embodiments of the present inventive concept. FIG. 3B is a circuit diagram of the quadrature divider 141 according to some embodiments of the present inventive concept. The quadrature divider 141 may have a circuit structure illustrated in FIG. 3B, but the present inventive concept is not restricted to the current embodiments.

Referring to FIGS. 3A and 3B, the quadrature divider 141 includes a latch circuit pair 300 and a phase compensator (320a, 320b, 320c, 320d). The latch circuit pair 300 includes a first latch 300a generating differential I local oscillation signals IP and IN and a second latch 300b which is cross-coupled with the first latch 300a and generates differential Q local oscillation signals QP and QN. The first latch 300a includes a phase delay unit 310a, a selector 330a, and a bias unit 340a. The second latch 300b includes a phase delay unit 310b, a selector 330b, and a bias unit 340b.

The phase delay unit 310a of the first latch 300a includes a first differential transistor pair 311a operating in response to a clock signal CK and a second differential transistor pair 312a operating in response to a complementary clock signal CKb. The complementary clock signal CKb is a signal that has the same frequency as the clock signal CK and has a 180-degree phase difference from the clock signal CK. The phase delay unit 310b of the second latch 300b includes a first differential transistor pair 311b operating in response to the complementary clock signal CKb and a second differential transistor pair 312b operating in response to the clock signal CK.

The first bias unit 340a is connected between a first bias node BN1 and a ground voltage and adjusts a bias current IDDI of the first latch 300a in response to a bias voltage Vb. The selector 330a of the first latch 300a includes a transistor which is connected between the first bias node BN1 and a first common node N1 to selectively operate the first differential transistor pair 311a in response to the clock signal CK and a transistor which is connected between the first bias node BN1 and a second common node N2 to selectively operate the second differential transistor pair 312a in response to the complementary clock signal CKb.

The second bias unit 340b is connected between a second bias node BN2 and the ground voltage and adjusts a bias current IDDQ of the second latch 300b in response to the bias voltage Vb. The selector 330b of the second latch 300b includes a transistor which is connected between the second bias node BN2 and a third common node N3 to selectively operate the first differential transistor pair 311b in response to the complementary clock signal CKb and a transistor which is connected between the second bias node BN2 and a fourth common node N4 to selectively operate the second differential transistor pair 312b in response to the clock signal CK.

The first latch 300a may also include a load connected between the first differential transistor pair 311a and a first power supply voltage VDD. The second latch 300b may also include a load connected between the first differential transistor pair 311b and the first power supply voltage VDD.

The phase delay units 310a and 310b delay the phase of an I waveform and the phase of a Q waveform, respectively. The selectors 330a and 330b selectively operate the phase delay units 310a and 310b, respectively. When the bias voltage Vb is applied to the bias units 340a and 340b, and the clock signal CK and the complementary clock signal CKb are applied to the selectors 330a and 330b, the phase delay units 310a and 310b start to operate.

In detail, when the clock signal CK is at a first logic level (e.g., a high level or a level of "1"), the first differential transistor pair 311a of a first stage A operates. The differential Q local oscillation signals QP and QN are respectively applied to gates of the first differential transistor pair 311a. At this time, the signal QP may be at a logic level of "0" and the signal QN may be at a logic level of "1". In this case, a first transistor 1a of the first differential transistor pair 311a of the first stage A is off and a second transistor 2a thereof is on. Accordingly, the differential I local oscillation signals IP and IN have a logic level of "1" and a logic level of "0", respectively. The differential I local oscillation signals IP and IN are respectively applied to gates of the second differential transistor pair 312a. However, the second differential transistor pair 312a of the first stage A operates only when the clock signal CK is at a second logic level (e.g., a low level or a level of "0").

When the clock signal CK is at the second logic level (i.e., the low level or the level of "0"), the second differential transistor pair 312a of the first stage A and the first differential transistor pair 311b of a second stage B operate. Due to the operation of the first differential transistor pair 311a of the first stage A, the signal IP having the logic level of "1" and the signal IN having the logic level of "0" are respectively applied to gates of the second differential transistor pair 312a of the first stage A. As a result, a third transistor 3a of the second differential transistor pair 312a of the first stage A is off and a fourth transistor 4a thereof is on. Hence, the signal IP having the logic level of "1" and the signal IN having the logic level of "0" are respectively applied to gates of the first differential transistor pair 311b of the second stage B.

Due to the operation of the second differential transistor pair 312a of the first stage A, the signal IP having the logic level of "1" and the signal IN having the logic level of "0" are respectively applied to the gates of the first differential transistor pair 311b of the second stage B. Therefore, a first transistor 1b of the first differential transistor pair 311b of the second stage B is on and a second transistor 2b thereof is off. Accordingly, the signals QN and QP respectively transition to a logic level of "0 and a logic level of "1" and are respectively applied to gates of the second differential transistor pair 312b of the second stage B. However, the second differential transistor pair 312b of the second stage B operates only when the clock signal CK is at the first logic level (i.e., the high level or the level of "1").

Due to the operation of the first differential transistor pair 311b of the second stage B, the signal QN having the logic level of "0" and the signal QP having the logic level of "1" are respectively applied to the gates of the second differential transistor pair 312b having the second stage B. As a result, a third transistor 3b of the second differential transistor pair 312b of the second stage B is on and a fourth transistor 4b thereof is off. Hence, the signal QN having the logic level of "0" and the signal QP having the logic level of "1" are respectively applied to the gates of the first differential transistor pair 311a of the first stage A.

How the latch circuit pair 300 operates at the first and second stages A and B in response to the clock signal CK has been described above. The above-described operation may be repeated in accordance with the first logic level (i.e., the high level or the level of "1") and the second logic level (i.e., the low level or the level of "0") of the clock signal CK.

Figure 3C:
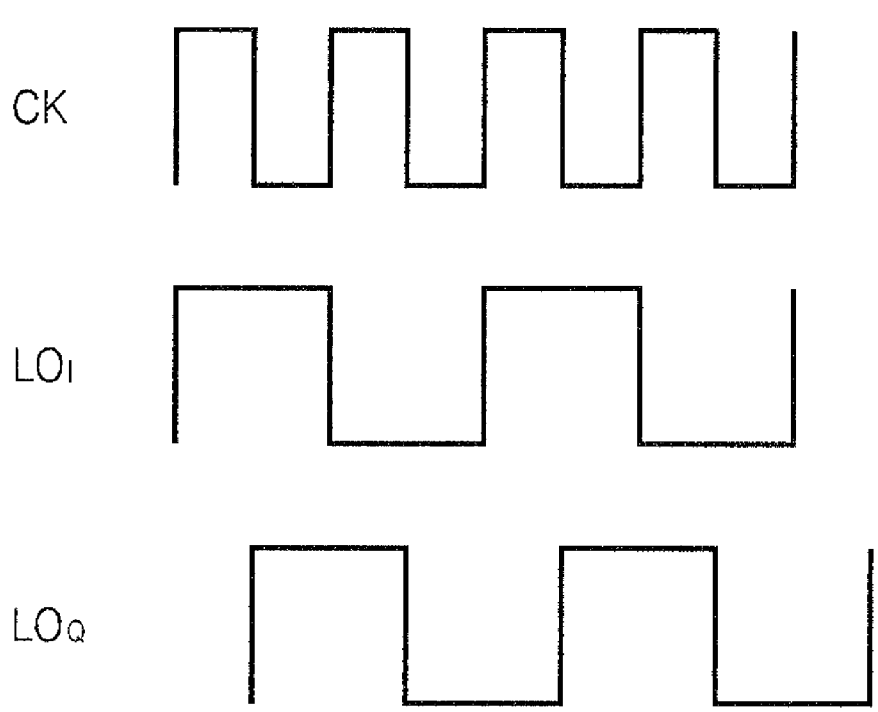
FIG. 3C is a waveform diagram showing an in-phase (I) local oscillation signal and a quadrature-phase (Q) local oscillation signal according to the operation of a pair of latch circuits of FIG. 3A operating in response to a clock signal.

FIG. 3C is a waveform diagram showing the I local oscillation signal $LO_I$ and the Q local oscillation signal $LO_Q$ according to the operation of the latch circuit pair 300 of FIG. 3A operating in response to the clock signal CK. Referring to FIG. 3C, the I local oscillation signal $LO_I$ corresponds to the differential I local oscillation signals IP and IN, and the Q local oscillation signal $LO_Q$ corresponds to the differential Q local oscillation signals QP and QN.

The phase compensator (320a, 320b, 320c, 320d) complementarily adjust bias currents of the first and second differential transistor pairs 311a and 312a of the first stage A and complementarily adjust bias currents of the first and second differential transistor pairs 311b and 312b of the second stage B, thus adjusting the phase of the I local oscillation signal $LO_I$ and the phase of the Q local oscillation signal $LO_Q$. As a result, an I/Q mismatch is compensated for. Here, the complementary adjustment of bias currents is a process of increasing one of the bias currents, e.g., the bias current of the first differential transistor pair 311a of the first stage A and decreasing the other, e.g., the bias current of the second differential transistor pair 312a of the first stage A. The increment of the bias current may be the same as the decrement thereof.

The phase compensator (320a, 320b, 320c, 320d) includes a first offset current source 320a which is connected to the first common node N1, i.e., a common source node of the first differential transistor pair 311a of the first stage A to supply a first offset current $\Delta$IOFF to the first common node N1; and a second offset current source 320b which is connected to the second common node N2, i.e., a common source node of the second differential transistor pair 312a of the first stage A to supply a second offset current $-\Delta$IOFF to the second common node N2. The phase compensator (320a, 320b, 320c, 320d) also includes a third offset current source 320c which is connected to the third common node N3, i.e., a common source node of the first differential transistor pair 311b of the second stage B to supply a third offset current $-\Delta$IOFF to the third common node N3; and a fourth offset current source 320d which is connected to the fourth common node N4, i.e., a common source node of the second differential transistor pair 312b of the second stage B to supply a fourth offset current $\Delta$IOFF to the fourth common node N4.

For instance, the phase compensator (320a, 320b, 320c, 320d) may apply offset currents having the same magnitude and different polarities to the first and second differential transistor pairs 311a and 312a, respectively, of the first stage A and apply offset currents having the same magnitude and different polarities to the first and second differential transistor pairs 311b and 312b, respectively, of the second stage B. Through this operation, the phase compensator (320a, 320b, 320c, 320d) increases the bias currents of the differential transistor pairs 311a and 312b operating in response to the clock signal CK while decreasing the bias currents of the differential transistor pairs 312a and 311b operating in response to the complementary clock signal CKb or vice versa.

Figure 4A:
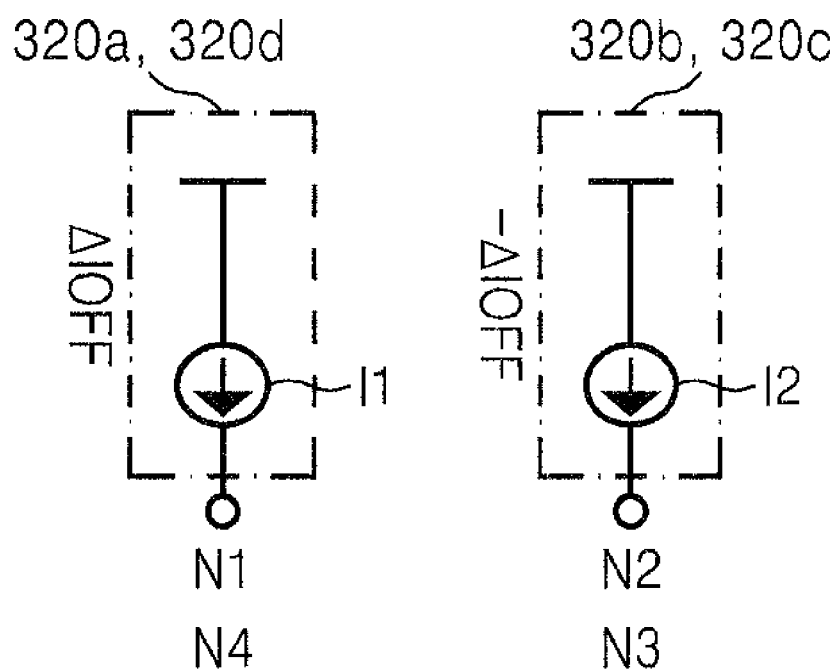
FIG. 4A is a diagram of a phase compensator according to some embodiments of the present inventive concept.

FIG. 4A is a diagram of the phase compensator (320a, 320b, 320c, 320d) according to some embodiments of the present inventive concept. The phase compensator (320a, 320b, 320c, 320d) is implemented using offset sources I1 and I2, but the present inventive concept is not restricted to the current embodiments.

Figure 4B:
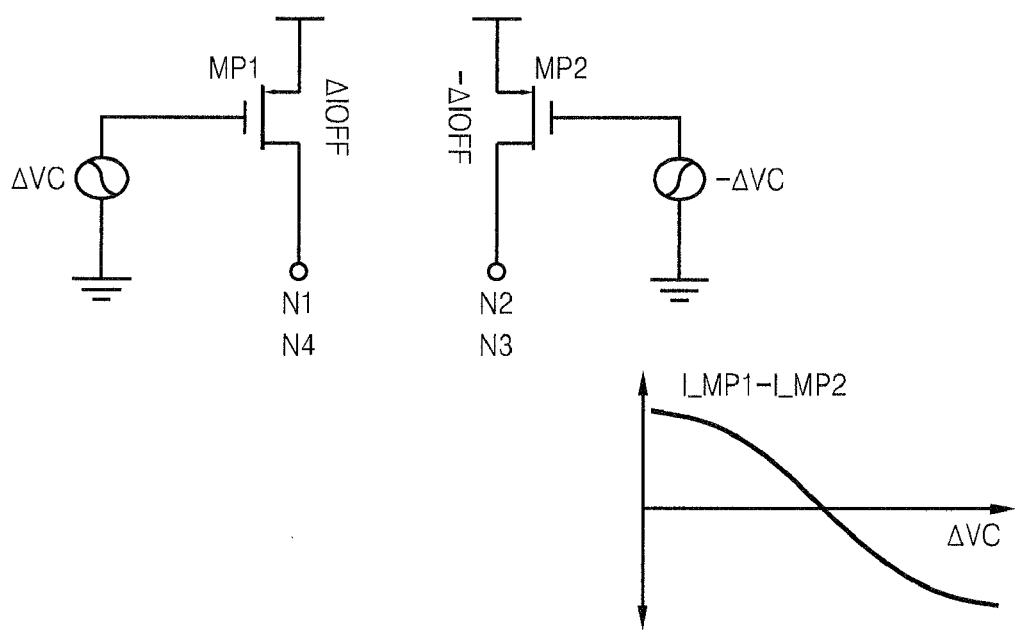
FIGS. 4B and 4C are circuit diagrams of examples of offset current sources illustrated in FIG. 4A.
Figure 4C:
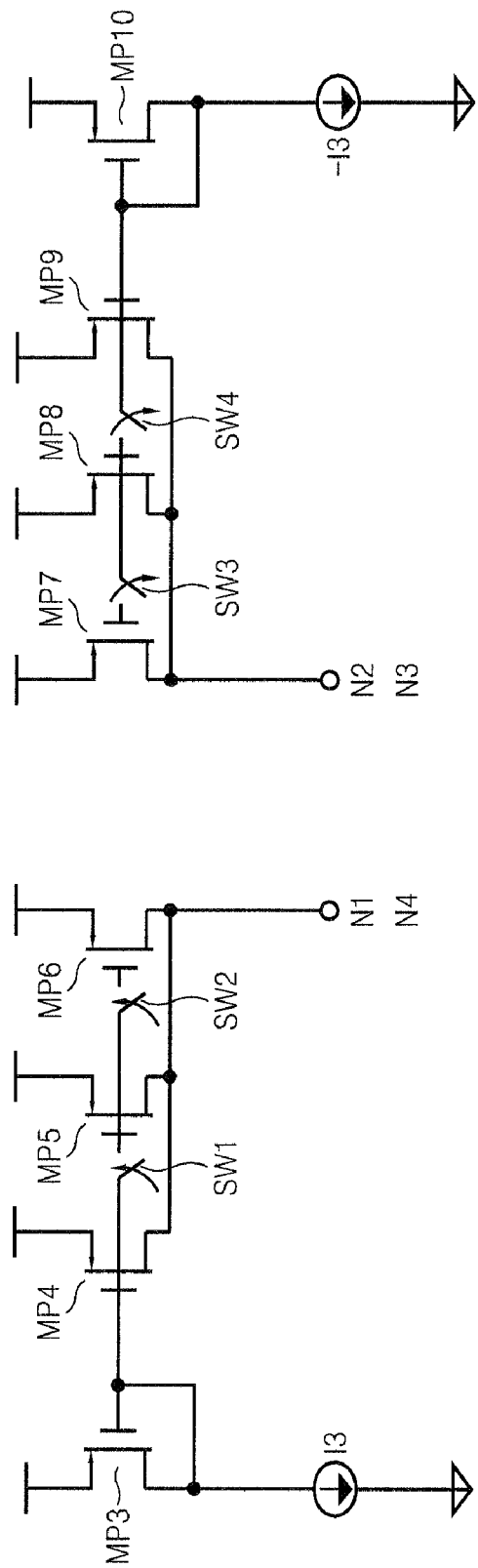

FIGS. 4B and 4C are circuit diagrams of examples of the offset current sources I1 and I2 illustrated in FIG. 4A. Referring to FIG. 4B, each of the first through fourth offset current sources 320a through 320d is implemented by a transistor MP1 or MP2 which is connected between a voltage source and a corresponding one of the common nodes N1 through N4 and operates in response to an analog voltage $\Delta$VC or $-\Delta$VC of an analog voltage source.

In the embodiments illustrated in FIG. 4B, the offset currents $\Delta$IOFF and $-\Delta$IOFF are decreased or increased by increasing or decreasing the analog voltages $\Delta$VC and $-\Delta$VC. The analog voltages $\Delta$VC and $-\Delta$VC may vary with a phase mismatch amount between the I signal $I_R$ and the Q signal $Q_R$ detected by the I/Q mismatch detector 170. The I/Q mismatch detector 170 may detect the phase mismatch amount in real time, so that the offset currents $\Delta$IOFF and $-\Delta$IOFF are changed in real time. Alternatively, the I/Q mismatch detector 170 may detect the phase mismatch amount in non-real time, i.e., when a particular event occurs, e.g., when the receiver 100 is turned on or is reset. The graph illustrated in FIG. 4B shows a difference between a current I_MP1 flowing in the transistor MP1 and a current I_MP2 flowing in the transistor MP2 with respect to the analog voltage $\Delta$VC.

FIG. 4C shows an example of the offset current sources I1 and I2, which changes an offset current using digital control. Referring to FIG. 4C, each of the first through fourth offset current sources 320a through 320d includes a current mirror circuit. The current mirror circuit may include at least one transistor MP5, MP6, MP7, or MP8 which is connected between a voltage source and a corresponding one of the common nodes N1 through N4 and selectively operates in response to a digital control signal.

The digital control signal is applied to a corresponding switch among switches SW1, SW2, SW3, and SW4 which opens or closes in the current mirror circuit. The offset currents $\Delta$IOFF and $-\Delta$IOFF may be decreased or increased by controlling short-circuit of the switches SW1 through SW4 using the digital control signal.

For instance, when the first switch SW1 and the second switch SW2 are open, a current I3 equal to a current flowing in a transistor MP3 flows in a transistor MP4 and no current flows in the transistors MP5 and MP6. As a result, an offset current as much as the current I3 is supplied to the node N1 or N4. When the first switch SW1 closes, the current I3 flows in the transistor MP5 as well as the transistor MP4. Hence, a current 2I3 (=I3+I3) is supplied to the node N1 or N4. When the first and second switches SW1 and SW2 close, the current I3 flows in the transistor MP6 as well as the transistors MP4 and MP5. Hence, a current 3I3 (=I3+I3+I3) is supplied to the node N1 or N4. If the transistors MP3, MP4, and MP6 are different in size, the offset current will be adjusted differently.

When the third switch SW3 and the fourth switch SW4 close, a current −I3 equal to a current flowing in a transistor MP10 flows in transistors MP7, MP8, and MP9. As a result, a current −3I3 (=−I3−I3−I3) is supplied to the node N2 or N3. When only the fourth switch SW4 closes, the current −I3 flows only in the transistors MP8 and MP9. Thus, a current −2I3 (=−I3−I3) is supplied to the node N2 or N3. When both of the third and fourth switches SW3 and SW4 are open, the current −I3 flows only in the transistor MP9. Thus, the current −I3 is supplied to the node N2 or N3. The digital control signal may vary with a phase mismatch amount between the I signal $I_R$ and the Q signal $Q_R$ detected by the I/Q mismatch detector 170.

Figure 5:
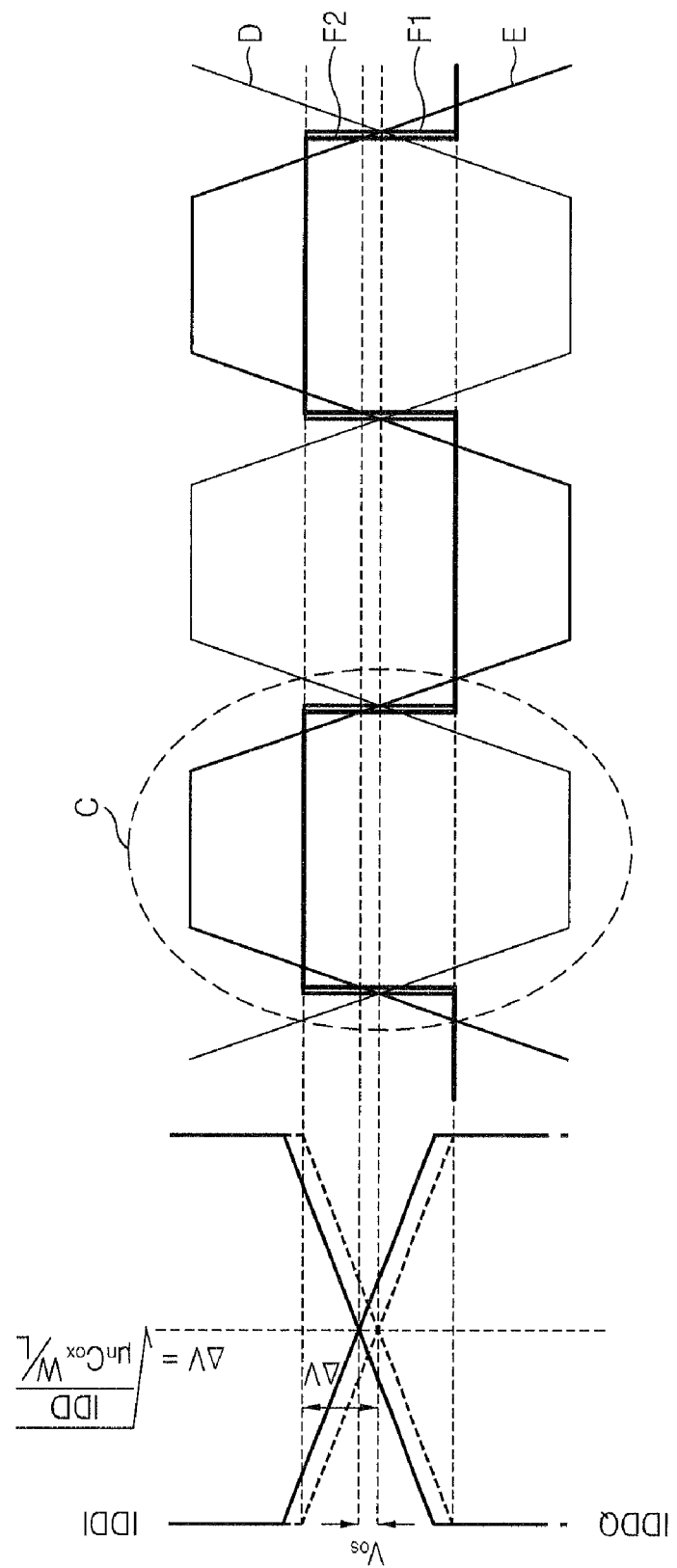
FIG. 5 is a diagram showing that the output duty cycle of a first differential transistor pair and a second differential transistor pair is adjusted using a voltage offset generated by supply of an offset current.

FIG. 5 is a diagram showing that the output duty cycle of the first differential transistor pair 311a or 311b and the second differential transistor pair 312a or 312b is adjusted using a voltage offset $V_{OS}$ generated by supply of an offset current. Due to the voltage offset $V_{OS}$, a trip point between the waveform of the first bias current IDDI and the waveform of the second bias current IDDQ illustrated in FIG. 3B shifts as much as the voltage offset $V_{OS}$. Assuming a signal making a level transition on the basis of the trip point between the first and second bias currents IDDI and IDDQ, the signal changes from F1 to F2 as illustrated in FIG. 5. In other words, F1 corresponds to a signal which makes a level transition on the basis of the trip point between the first and second bias currents IDDI and IDDQ when the voltage offset $V_{OS}$ does not exist and F2 corresponds to a signal which makes a level transition on the basis of the trip point between the first and second bias currents IDDI and IDDQ when the voltage offset $V_{OS}$ occurs due to the supply of an offset current. Accordingly, when the voltage offset $V_{OS}$ occurs due to the supply of an offset current, the duty cycle of the clock signals CK and CKb changes.

The change of the duty cycle of the clock signals CK and CKb leads to the change of the outputs IP, QP, IN, and QN of the first and second differential transistor pairs 311a, 311b, 312a, and 312b, so that the phase of the I local oscillation signal $LO_I$ and the phase of the Q local oscillation signal $LO_Q$ are adjusted. As a result, a phase mismatch between the baseband I signal $I_R$ and the baseband Q signal $Q_R$ is compensated for.

As described above, according to some embodiments of the present inventive concept, instead of directly changing the duty cycle of the clock signals CK and CKb, an offset current is supplied to adjust the voltage offset $V_{OS}$, thereby indirectly changing the duty cycle of the clock signals CK and CKb. Thus, the phase of the I local oscillation signal $LO_I$ and the phase of the Q local oscillation signal $LO_Q$ are adjusted. The voltage offset $V_{OS}$ is given by Equation (1):

$$V_{OS} = \sqrt{\frac{2ID_1}{\mu_n C_{ox}\left(\frac{W}{L}\right)_1}} + V_{TH1} - \sqrt{\frac{2ID_2}{\mu_n C_{ox}\left(\frac{W}{L}\right)_2}} - V_{TH2}$$
$$= \sqrt{\frac{2}{\mu_n C_{ox}}} \left[ \sqrt{\frac{I_D}{W/L}} - \sqrt{\frac{I_D + \Delta I}{W/L + \Delta W/L}} \right] - \Delta V_{TH},$$
$$= \sqrt{\frac{2}{\mu_n C_{ox}(W/L)}} \left(\frac{\Delta I}{2I_D}\right) \quad (1)$$

where $V_{OS}$ is a voltage offset, $\mu_n$ is an effective charge carrier mobility, W is the width of a gate, L is the length of the gate, $C_{ox}$ is a capacitance of a gate oxide layer per unit area, and $\Delta I$ is an offset current.

Figure 6:
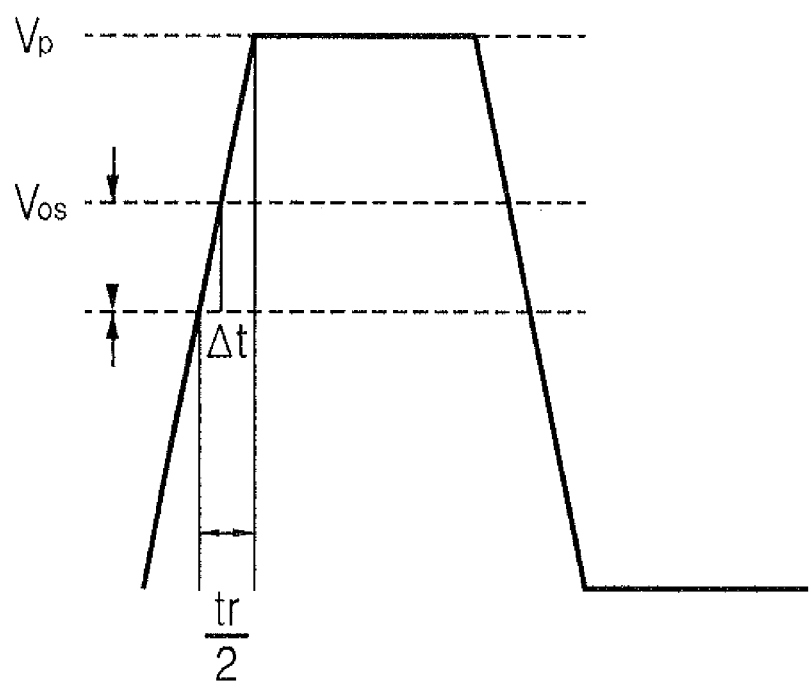
FIG. 6 is an enlarged diagram of the circled part in FIG. 5, which shows in detail the duty cycle changing with respect to a voltage offset.

FIG. 6 is an enlarged diagram of the circled part C in FIG. 5, which shows in detail the duty cycle changing with respect to the voltage offset $V_{OS}$. When the voltage offset $V_{OS}$ occurs, the waveform of the clock signal CK shifts by $\Delta t$ which is given by Equation (2):

$$\frac{V_p}{tr/2}\Delta t = V_{OS} \quad (2)$$
$$\Delta t = V_{OS}\frac{tr}{2V_p},$$

where $V_{OS}$, $V_P$, $\Delta t$, and tr/2 are shown in FIG. 6.

From Equations (1) and (2), the relationship between $\Delta t$ and $\Delta I$ is defined as Equation (3):

$$\Delta t = V_{OS}\frac{tr}{2V_p} \propto \Delta I. \quad (3)$$

In other words, $\Delta t$ is proportional to $\Delta I$.

Figure 7A:
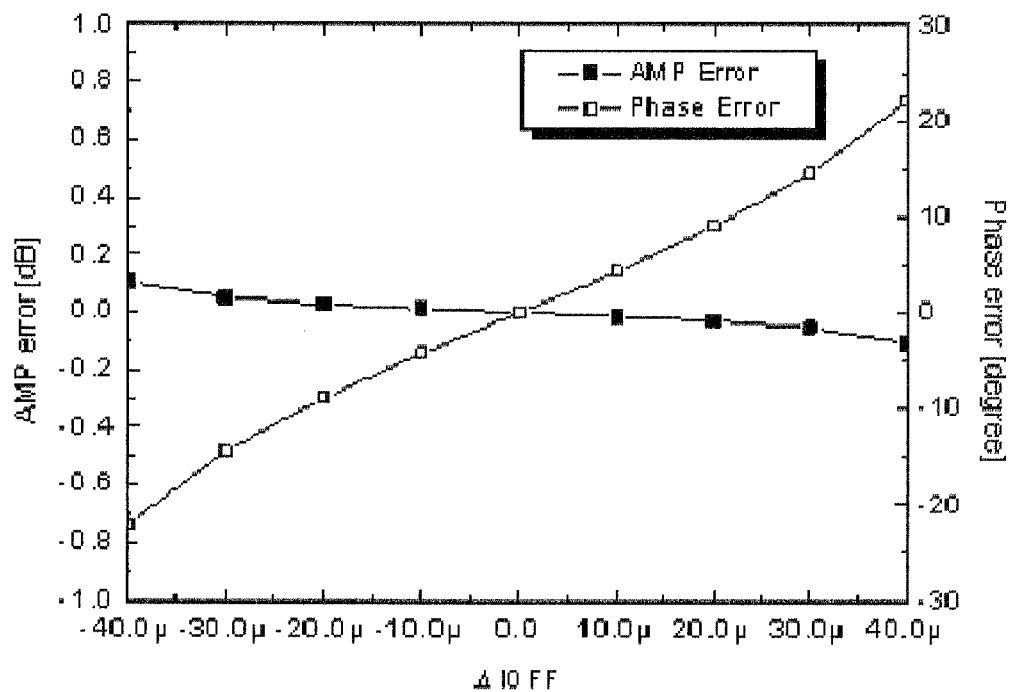
FIG. 7A is a graph showing amplitude error and phase error with respect to the change in an offset current in some embodiments of the present inventive concept.
Figure 7B:
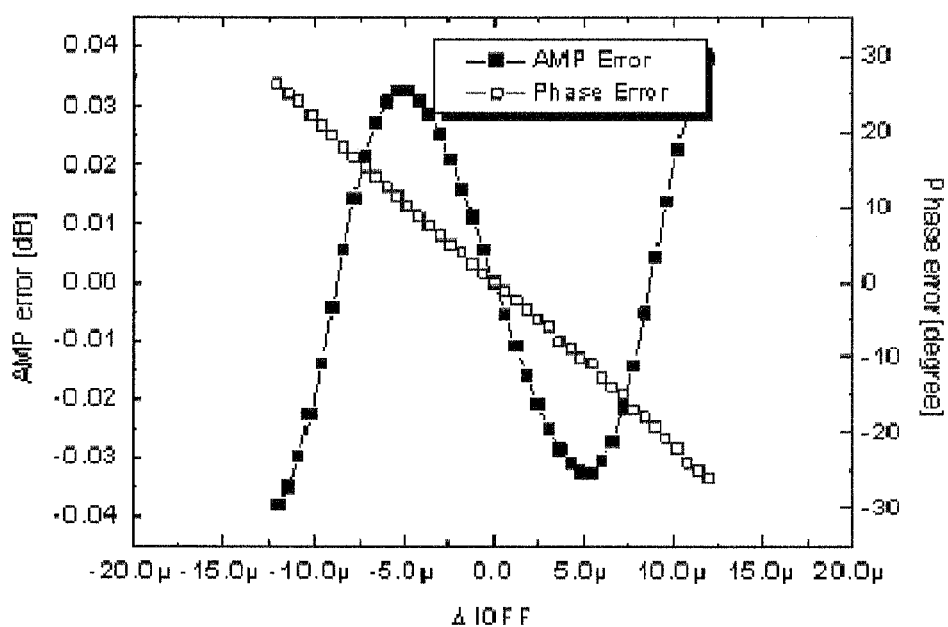
FIG. 7B is an enlarged graph of a part of the graph of FIG. 7A.

FIG. 7A is a graph showing amplitude error and phase error with respect to the change in an offset current $\Delta IOFF$ in some embodiments of the present inventive concept. FIG. 7B is an enlarged graph of a part of the graph of FIG. 7A. Referring to FIGS. 7A and 7B, the phase error can be changed by changing the offset current $\Delta IOFF$ supplied by the phase compensator (320a, 320b, 320c, 320d). When the offset current $\Delta IOFF$ is changed, the amplitude error does not much change while the phase error relatively changes a lot. The change of the phase error has linearity. Since the change of the phase error has linearity, the offset current $\Delta IOFF$ can be changed taking into account the degree of phase error, so that a phase mismatch can be efficiently compensated for.

Figure 8:
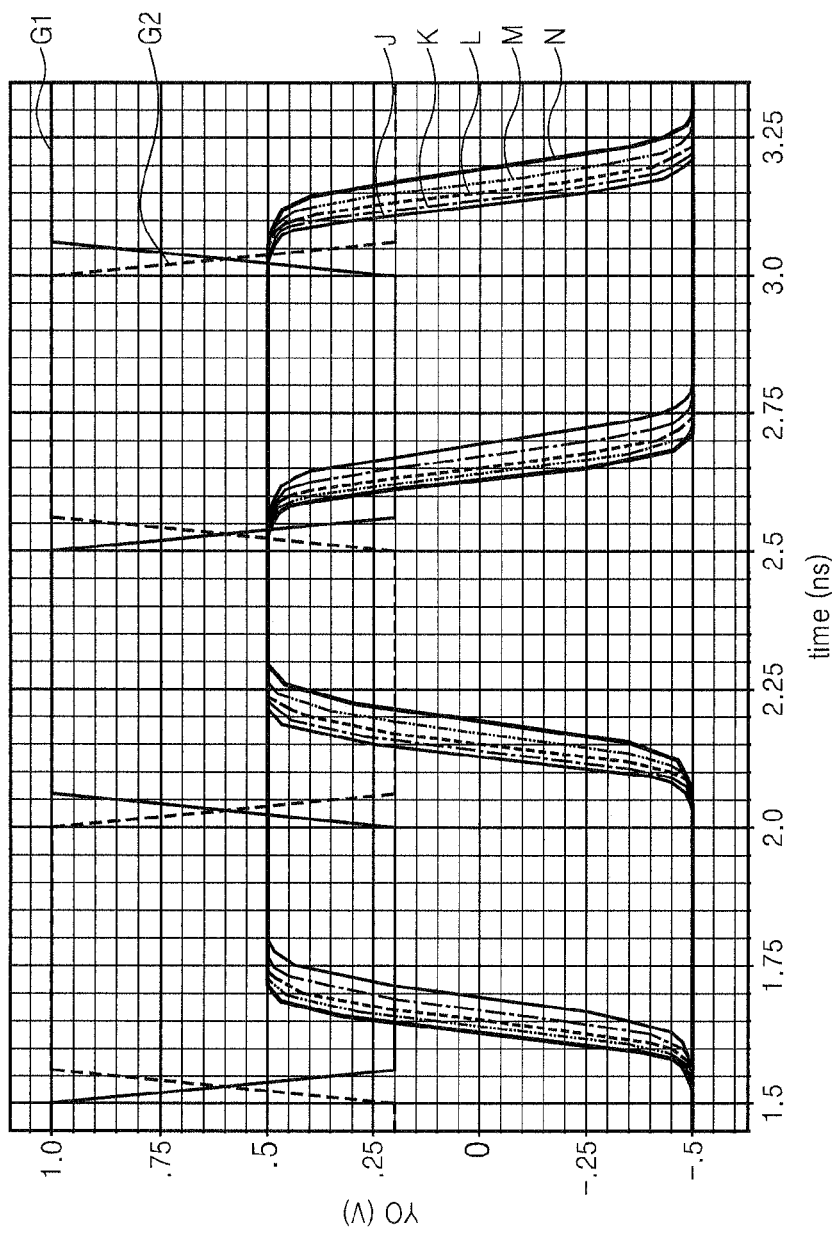
FIG. 8 is a graph showing the change in a phase with respect to an offset current in some embodiments of the present inventive concept.

FIG. 8 is a graph showing the change in a phase with respect to an offset current in some embodiments of the present inventive concept. Reference characters G1 and G2 denote waveforms input to the first and second differential transistor pairs 311a and 312a or 311b and 312b. Reference characters J, K, L, M, and N denote I/Q output waveforms.

Referring to FIG. 8, when the offset current changes, the interval of an I/Q output waveform changes. The I/Q output waveform L appears when the offset current does not exist. The I/Q output waveforms J, K, M, and N appear when the offset current is 20, 10, −10, and −20 uA, respectively. When the offset current changes from 20 uA (i.e., J) to −20 uA (i.e., N), the interval of the I/Q output waveform increases. In detail, when the offset current is 20 uA, the corresponding I/Q output waveform J has the shortest interval. When the offset current is −20 uA, the corresponding I/Q output waveform N has the longest interval. In other words, the phase of the I/Q output waveform is changed by the change of the offset current.

Figure 9:
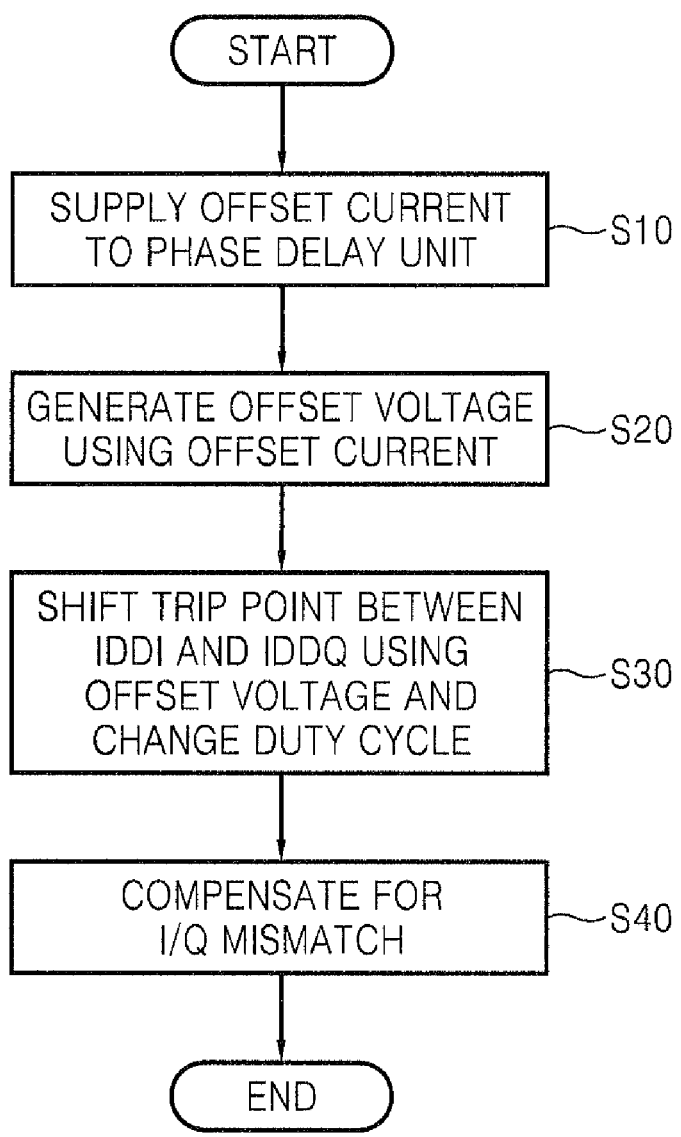
FIG. 9 is a flowchart of a procedure for compensating for an I/Q mismatch according to some embodiments of the present inventive concept.

FIG. 9 is a flowchart of a procedure for compensating for an I/Q mismatch according to some embodiments of the present inventive concept. The procedure illustrated in FIG. 9 may be performed by the quadrature divider 141 illustrated in FIG. 3A. An offset current is supplied to the phase delay units 310a and 310b included in the quadrature divider 141 using the phase compensator (320a, 320b, 320c, 320d) in operation S10. An offset voltage is generated by the offset current in operation S20. A trip point between the bias currents IDDI and IDDQ is shifted by a voltage offset due to the offset voltage, thus changing the duty cycle of an output signal (i.e., an I oscillation signal and/or a Q oscillation signal) in operation S30. An I/Q mismatch is compensated for by the change of the duty cycle of the output signal in operation S40. At this time, as a result of the compensation of the I/Q mismatch, I and Q signals have a phase difference of 90 degrees from each other.

The present inventive concept can be embodied in hardware, software, firmware or combination thereof. When the method is embodied in software, it can be embodied as computer readable codes or programs on a computer readable recording medium. The computer readable recording medium is any data storage device that can store data which can be thereafter read by a computer system. Examples of the computer readable recording medium may includes read-only memory (ROM), random-access memory (RAM), electrically erasable programmable ROM (EEPROM), and flash memory.

According to some embodiments of the present inventive concept, an I/Q mismatch is compensated for, thus improving the phase match between an I signal and a Q signal in a transmitter and a receiver. In addition, the I/Q mismatch is compensated for without an additional phase shift block.

While the present inventive concept has been particularly shown and described with reference to exemplary embodiments thereof, it will be understood by those of ordinary skill in the art that various changes in forms and details may be made therein without departing from the spirit and scope of the present inventive concept as defined by the following claims.

What is claimed is:

1. An oscillation signal generator for compensating for an in-phase (I)/quadrature-phase (Q) mismatch, the oscillation signal generator comprising:
    a first latch configured to generate an I oscillation signal;
    a second latch that is cross-coupled with the first latch and generates a Q oscillation signal; and a phase compensator connected to at least one of the first latch or the second latch, wherein the first latch comprises:

a first I differential transistor pair configured to operate in response to a clock signal; and a second I differential transistor pair configured to operate in response to a complementary clock signal, the second latch comprises:

a first Q differential transistor pair configured to operate in response to the complementary clock signal; and a second Q differential transistor pair configured to operate in response to the clock signal, and the phase compensator complementarily adjusts a bias current of the first I differential transistor pair and a bias current of the second I differential transistor pair and/or complementarily adjusts a bias current of the first Q differential transistor pair and a bias current of the second Q differential transistor pair, wherein the phase compensator comprises:

a first offset current source that is connected to a first common node of the first I differential transistor pair and supplies a first offset current to the first common node; and a second offset current source that is connected to a second common node of the second I differential transistor pair and supplies a second offset current to the second common node.

2. The oscillation signal generator of claim 1, wherein the phase compensator further comprises:

a third offset current source that is connected to a third common node of the first Q differential transistor pair and supplies a third offset current to the third common node; and a fourth offset current source that is connected to a fourth common node of the second Q differential transistor pair and supplies a fourth offset current to the fourth common node.

3. The oscillation signal generator of claim 2, wherein the first offset current and the second offset current have the same absolute amount as each other and different polarities from each other, and the third offset current and the fourth offset current have the same absolute amount as each other and different polarities from each other.

4. The oscillation signal generator of claim 2, wherein the first latch further comprises:

a load connected between the first I differential transistor pair and a first power supply voltage;

a first bias unit which is connected between a first bias node and a second power supply voltage and controls a bias current of the first latch in response to a bias voltage; and a first selector which is connected between the first bias node and the first and second common nodes and selectively operates the first I differential transistor pair and the second I differential transistor pair in response to the clock signal and the complementary clock signal, and the second latch further comprises:

a load connected between the first Q differential transistor pair and the first power supply voltage;

a second bias unit which is connected between a second bias node and the second power supply voltage and controls a bias current of the latch in response to the bias voltage; and a second selector which is connected among the second bias node and the third and fourth common nodes and selectively operates the first Q differential transistor pair and the second Q differential transistor pair in response to the clock signal and the complementary clock signal.

5. The oscillation signal generator of claim 2, wherein each of the first through fourth offset currents varies with a phase mismatch amount between an I receiving signal and a Q receiving signal.

6. The oscillation signal generator of claim 2, wherein each of the first through fourth offset current sources comprises at least one transistor which is connected between a voltage source and a corresponding node among the first through fourth common nodes and operates in response to one between a voltage and a digital control signal which vary with an mount of the I/Q mismatch.

7. The oscillation signal generator of claim 2, wherein a duty cycle of at least one of the I oscillation signal or the Q oscillation signal varies with the first through fourth offset currents.

8. A communication system comprising:

the oscillation signal generator of claim 2;

a local oscillator that is connected to the oscillation signal generator and generates an oscillation signal having a two times higher frequency than that of the I oscillation signal and the Q oscillation signal; and a phase mismatch detector configured to detect an amount of a phase mismatch between an I signal and a Q signal.

9. The communication system of claim 8, further comprising:

a first mixer configured to mix a radio frequency signal with the I oscillation signal; and a second mixer configured to mix the radio frequency signal with the Q oscillation signal, wherein an I receiving signal is generated from an output signal of the first mixer and a Q receiving signal is generated from an output signal of the second mixer.

10. An oscillation signal generator for compensating for an in-phase (I)/quadrature-phase (Q) mismatch, the oscillation signal generator comprising:

a first latch configured to generate an I oscillation signal;

a second latch that is cross-coupled with the first latch and generates a Q oscillation signal; and a phase compensator connected to at least one of the first latch or the second latch, wherein the first latch comprises:

a first I differential transistor pair configured to operate in response to a clock signal; and a second I differential transistor pair configured to operate in response to a complementary clock signal, the phase compensator complementarily adjusts a bias current of the first I differential transistor pair and a bias current of the second I differential transistor pair, wherein the phase compensator comprises:

a first offset current source that is connected to a first common node of the first I differential transistor pair and supplies a first offset current to the first common node; and a second offset current source that is connected to a second common node of the second I differential transistor pair and supplies a second offset current to the second common node.

11. A communication system comprising:

an oscillation signal generator for compensating for an in-phase (I)/quadrature-phase (Q) mismatch, the oscillation signal generator comprising:

a first latch configured to generate an I oscillation signal;

a second latch that is cross-coupled with the first latch and generates a Q oscillation signal; and a phase compensator connected to at least one of the first latch or the second latch, wherein the first latch comprises:

a first I differential transistor pair configured to operate in response to a clock signal; and a second I differential transistor pair configured to operate in response to a complementary clock signal, the phase compensator complementarily adjusts a bias current of the first I differential transistor pair and a bias current of the second I differential transistor pair;

a local oscillator that is connected to the oscillation signal generator and generates an oscillation signal having a two times higher frequency than that of the I oscillation signal and the Q oscillation signal; and a phase mismatch detector configured to detect an amount of a phase mismatch between an I signal and a Q signal.

12. An oscillation signal generator for compensating for an in-phase (I)/quadrature-phase (Q) mismatch, the oscillation signal generator comprising:

a first latch configured to generate an I oscillation signal;

a second latch that is cross-coupled with the first latch and generates a Q oscillation signal; and a phase compensator connected to at least one of the first latch or the second latch, wherein the first latch comprises:

a first I differential transistor pair configured to operate in response to a clock signal; and a second I differential transistor pair configured to operate in response to a complementary clock signal, and the phase compensator complementarily adjusts a bias current of the first I differential transistor pair and a bias current of the second I differential transistor pair, wherein the phase compensator further comprises:

a third offset current source that is connected to a third common node of the first Q differential transistor pair and supplies a third offset current to the third common node; and a fourth offset current source that is connected to a fourth common node of the second Q differential transistor pair and supplies a fourth offset current to the fourth common node.

13. A communication system comprising:

an oscillation signal generator for compensating for an in-phase (I)/quadrature-phase (Q) mismatch, the oscillation signal generator comprising:

a first latch configured to generate an I oscillation signal;

a second latch that is cross-coupled with the first latch and generates a Q oscillation signal; and a phase compensator connected to at least one of the first latch or the second latch, wherein the first latch comprises:

a first I differential transistor pair configured to operate in response to a clock signal; and a second I differential transistor pair configured to operate in response to a complementary clock signal, and the phase compensator complementarily adjusts a bias current of the first I differential transistor pair and a bias current of the second I differential transistor pair;

a local oscillator that is connected to the oscillation signal generator and generates an oscillation signal having a two times higher frequency than that of the I oscillation signal and the Q oscillation signal; and a phase mismatch detector configured to detect an amount of a phase mismatch between an I signal and a Q signal.

* * * * *